United States Patent
Micovic et al.

(10) Patent No.: US 6,670,653 B1
(45) Date of Patent: Dec. 30, 2003

(54) INP COLLECTOR INGAASSB BASE DHBT DEVICE AND METHOD OF FORMING SAME

(75) Inventors: Miroslav Micovic, Newbury Park, CA (US); Daniel P. Docter, Santa Monica, CA (US); Mehran Matloubian, Encino, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/364,730

(22) Filed: Jul. 30, 1999

(51) Int. Cl.$^7$ .................. H01L 21/331; H01L 29/737

(52) U.S. Cl. .............. 257/197; 257/198; 257/191; 257/201; 257/15; 257/22

(58) Field of Search ............... 257/197, 12, 15, 257/22, 192, 194, 28, 198, 201, 183, 565, 591, 593

(56) References Cited

U.S. PATENT DOCUMENTS

| | | | |
|---|---|---|---|
| 4,686,550 A | * 8/1987 | Capasso et al. | 357/16 |
| 4,821,082 A | * 4/1989 | Frank et al. | 357/34 |
| 5,164,800 A | * 11/1992 | Nakajima | 257/194 |
| 5,212,394 A | * 5/1993 | Iwasaki et al. | 257/1 |
| 5,349,201 A | 9/1994 | Stanchina et al. | 257/18 |
| 5,365,077 A | * 11/1994 | Metzger et al. | 257/15 |
| 5,606,185 A | * 2/1997 | Nguyen et al. | 257/197 |
| 5,612,551 A | * 3/1997 | Liu et al. | 257/197 |
| 5,665,614 A | * 9/1997 | Hafizi et al. | 438/320 |
| 5,726,462 A | * 3/1998 | Spahn et al. | 257/76 |
| 5,753,545 A | * 5/1998 | Liu et al. | 438/172 |
| 5,851,310 A | * 12/1998 | Freundlich et al. | 136/255 |
| 6,031,256 A | * 2/2000 | Liu et al. | 257/198 |
| 6,172,420 B1 | * 1/2001 | Shiralagi | 257/745 |
| 6,399,971 B1 | * 6/2002 | Shigematsu et al. | 257/197 |

FOREIGN PATENT DOCUMENTS

| | | | |
|---|---|---|---|
| EP | 0 715 357 | 6/1996 | |
| EP | 0 715 357 A1 | 6/1996 | |
| JP | 05206155 A | * 8/1993 | ......... H01L/21/331 |

OTHER PUBLICATIONS

English translation of JP5–206155–A.*

Patent Abstracts of Japan, vol. 016, No. 120 (E–1182), Mar. 1992, JP–03289135 (Dec. 1991).

Patent Abstracts of Japan, vol. 17, No. 636 (E–1464), Nov. 1993, JP–05206155 (Aug. 1993).

Patent Abstracts of Japan, vol. 18, No. 105 (E–1512), Feb. 1994, JP–05304165 (Nov. 1993).

Patent Abstracts of Japan, vol. 15, No. 304 (E–1096), Aug. 1991, JP–03108725 (May 1991).

Patent Abstracts of Japan, vol. 7, No. 222 (E–201), Oct. 1983, JP–58114455 (Jul. 1983).

(List continued on next page.)

Primary Examiner—Bradley W. Baumeister
(74) Attorney, Agent, or Firm—Ladas & Parry

(57) ABSTRACT

A Double Heterojunction Bipolar Transistor (DHBT) is disclosed employing a collector of InP, an emitter of InP or other material such as InAlAs, and a base of either a selected $In_xGa_{1-x}As_ySb_{1-y}$ compound, which preferably is lattice-matched to InP or may be somewhat compressively strained thereto, or of a superlattice which mimics the selected InGaAsSb compound. When an emitter having a conduction band non-aligned with that of the base is used, such as InAlAs, the base-emitter junction is preferably graded using either continuous or stepped changes in bulk material, or using a chirped superlattice. Doping of the junction may include one or more delta doping layer to improve the shift of conduction band discontinuities provided by a grading layer, or to permit a wider depletion region.

16 Claims, 3 Drawing Sheets

OTHER PUBLICATIONS

Agarwal, et al., "A 277=Ghz fmax Transferred–Substrate Heterojunction Bipolar Transistor," *IEEE Electron Device Letters*, vol. 18, No. 5, pp. 228–231 (May 1997).

Bhat, et al., "InP/GaAsSb/Inp and InP/GaAsSb/InGaAsP double heterojunction bipolar transistors with a carbon–doped base grown by organometallic chemical vapor deposition," *Appl. Phys. Lett.*, vol. 68 (7), pp. 985–987 (Feb. 1996).

Liu, William, "Handbook of III–V Heterojunction Biopolar Transistors" John Wiley & Sons, pp. 249–252, 531–541, 1168–1171, 1217 (Mar. 1998).

McDermott, et al., "Growth and doping of GaAsSb via metalorganic chemical vapor deposition for InP heterojunction bipolar transistors," *Appl. Phys. Lett.*, vol. 68 (10), pp. 1386–1388 (Mar. 1996).

* cited by examiner

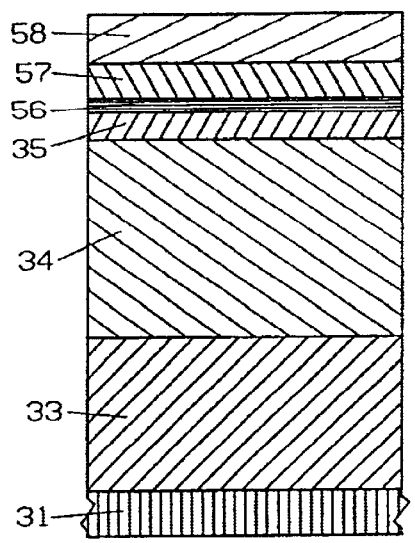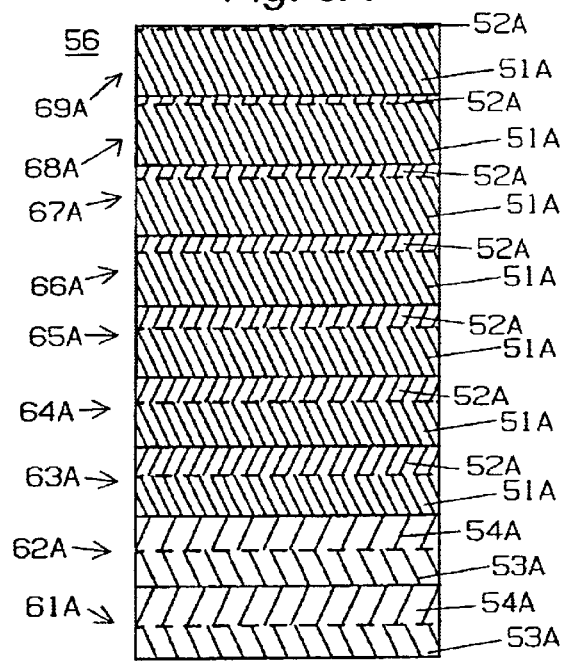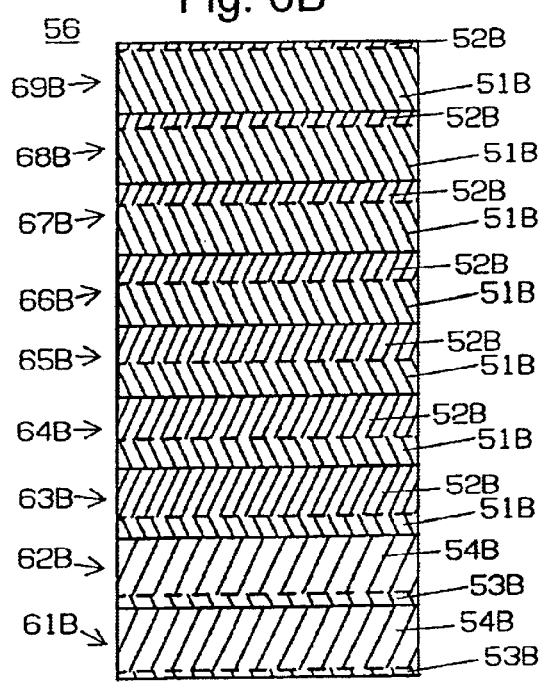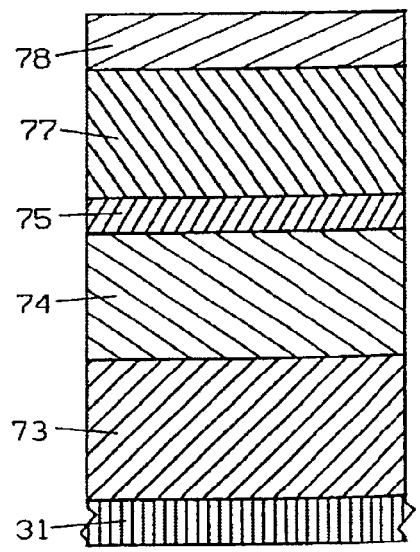

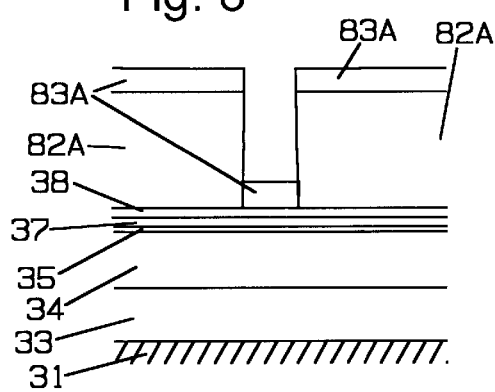
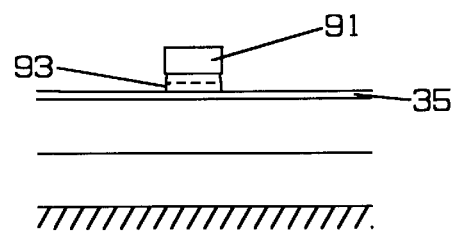
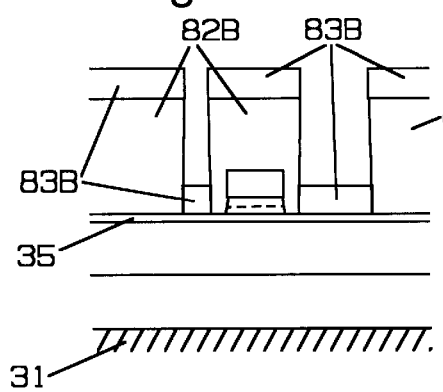
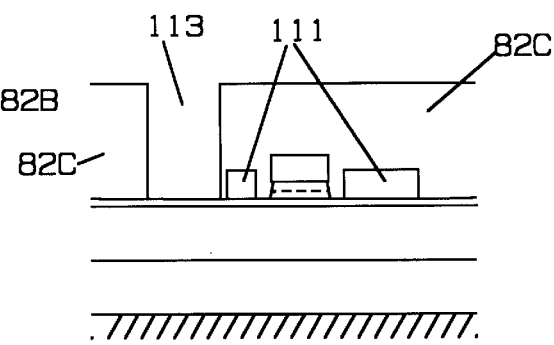
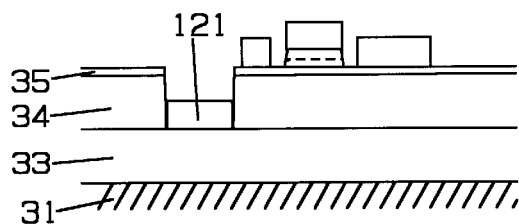
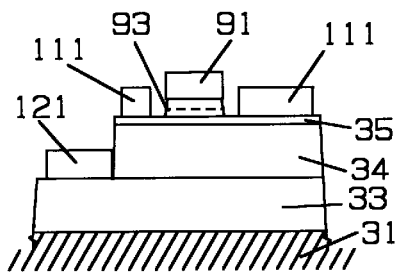

US 6,670,653 B1

INP COLLECTOR INGAASSB BASE DHBT DEVICE AND METHOD OF FORMING SAME

FIELD OF THE INVENTION

The present invention pertains to Bipolar Junction Transistors (BJTs), and more particularly to Double Heterojunction Bipolar Transistors (DHBTs).

BACKGROUND

InP is known to have advantages as a collector material. It has high electron saturation velocity, resulting in short collector transit times, and can support high breakdown voltages due to its large bandgap and breakdown fields. It also has better thermal conductivity than many materials, such as InAlAs and InGaAs (lattice-matched to InP), which enhances its heat dissipation. Furthermore, when highly doped it permits fabrication of non-alloyed ohmic contacts.

DHBTs having InP collectors are known. For example, William Liu in the *Handbook of III–V Heterojunction Bipolar Transistors*, 1998 John Wiley & Sons, describes a DHBT having an InP collector and a base of InGaAs. The difficulty of such a device is that InGaAs, at least if lattice-matched to InP, has a conduction band energy minimum which is lower than the conduction band energy minimum of InP. This results in electrons accumulating on the base side of the base-collector heterojunction.

DHBTs having an InP collector and a base of GaAsSb are also known. For example, U.S. Pat. No. 4,821,082 to Frank, et al., describes a DHBT having collector and emitter of InP, and a base of $GaAs_{0.53}Sb_{0.47}$. U.S. Pat. No. 5,349,201 to Stanchina, et al. and Publication EPO 715357 A1 to McDermott also describe DHBTs having collector and emitter of InP, and base of GaAsSb. The problem with this approach is that $GaAS_{0.53}Sb_{0.47}$ (GaAsSb lattice-matched to InP) has a conduction band energy minimum which is approximately 0.12 eV higher than that of InP. Although the combination of a base of GaAsSb, lattice-matched to a collector of InP, eliminates the problem of electron accumulation at the base-collector interface of the DHBT, it instead causes injection of high energy electrons into the collector from the base, because the electrons gain energy equal to the conduction band offset at the base-collector junction. Such injection of high energy electrons into the collector reduces base-collector breakdown voltage by facilitating impact ionization. If the base GaAsSb is instead formulated for conduction band energy matching to InP, then the material will be in tensile strain with respect to InP, which can degrade device reliability.

It is well known that the gain of a transistor is improved when the valence band energy level of the emitter is significantly lower than that of the base.

Accordingly, there is a need for a BJT device, and for a method of making such a device, incorporating the advantages offered by an InP collector, and wherein the conduction band energy minimum of the base is closely matched to that of the collector in order to avoid both accumulation of electrons at the base-collector junction (when the base conduction band energy minimum is too low), and injection of high-energy electrons from the base into the collector (when the base conduction band energy minimum is too high). Such a device preferably has little or no lattice mismatch, and has a base with valence band energy minimum significantly higher than that of the emitter.

It is an object of the present invention to provide a device, and a method of making the same, which fills this need.

SUMMARY OF THE INVENTION

The present invention employs a base which either is, or else mimics, a quaternary compound $In_xGa_{1-x}As_ySb_{1-y}$, in which x and y are preferably selected such that the compound is lattice-matched to InP. Lattice matching can be achieved for certain values of x and y within the range from (x,y)=(0.53, 1) to (x,y)=(0, 0.5). The most preferred formulation within this range is that in which the conduction band minimum energy of the compound is from 0 to 10 meV higher than the conduction band energy minimum of InP. $In_xGa_{1-x}As_ySb_{1-y}$ achieves such an optimum conduction band energy level when x is about 0.16 and y is about 0.65. The base may also be formulated to be somewhat compressively strained to InP, but if so then it is preferably thinner than critical thickness.

The base may be a desired formulation of monolithic InGaAsSb, or may be fabricated as a superlattice having alternating layers of ternary compounds such as InGaAs and InGaSb. The superlattice materials are preferably selected such that the average proportions of the elements in the overall superlattice structure are (approximately) the same as for the desired formulation of InGaAsSb. If the periods of the superlattice are sufficiently thin, the superlattice will mimic the properties of the corresponding monolithic quaternary compound of InGaAsSb.

Thin superlattice periods also help reduce disruption of the superlattice crystal structure due to strain. If a particular quaternary compound is lattice-matched to InP, then a superlattice having the same average formulation will generally have no net strain to InP. The sublayers of each period of such a superlattice will generally be strained, but the sum of strains over each period will generally equal zero.

InP is employed in the collector. The emitter of a device according to the present invention is preferably InP or InAlAs lattice-matched to InP. Each has advantages, and they differ largely in convenience for fabrication. For embodiments employing an InAlAs emitter, it is desirable to grade the base-emitter junction, for example by continuous composition change or using a chirped superlattice, to shift the discontinuity of conduction band energy minimum into the valence band. Delta doping techniques are helpful to improve the grading effects, and also to permit a wider depletion region.

BRIEF DESCRIPTION OF THE DRAWINGS

FIG. 5 depicts the epitaxial structure of an InAlAs/InGaAsSb/InP DHBT.

FIG. 6A is an epitaxial structure for a first optional chirped superlattice grading layer.

FIG. 6B is an epitaxial structure for a second optional chirped superlattice grading layer.

FIG. 7 depicts the epitaxial structure of a symmetrical InP/InGaAsSb/InP DHBT.

FIG. 8 depicts photoresist mask placement of an emitter contact.

FIG. 9 shows emitter and contact after etch using emitter contact as mask.

FIG. 10 depicts photoresist mask placement of a base contact.

FIG. 11 depicts photoresist mask for etching to subcollector contact area.

FIG. 12 depicts a device with collector contact in place.

FIG. 13 shows a device after isolation etching.

DETAILED DESCRIPTION

Figure 1:
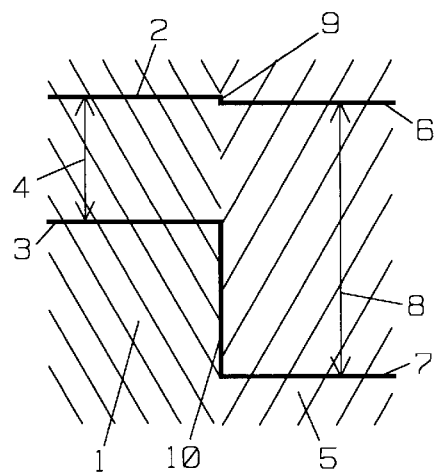
FIG. 1 shows the preferred base-collector junction conduction and valence band lineups.
Figure 2:
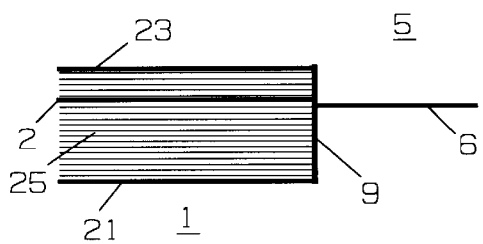
FIG. 2 shows a range of conduction band lineups of InP and lattice-matched InGaAsSb.

FIG. 2 shows, for $In_xGa_{1-x}As_ySb_{1-y}$ base material 1, conduction band energy minimums 25 as x and y are varied while maintaining lattice matching to InP. Conduction band energy 6 of InP collector 5 is shown for comparison. $In_xGa_{1-x}As_ySb_{1-y}$ can be lattice-matched to InP within the range from (x,y)=(0.53, 1) to (x,y)=(0, 0.5). Under these conditions, optimal base conduction band energy minimum 2 lies between maximal base conduction band energy minimum 23 and minimal base conduction band energy minimum 21. Minimal conduction band energy minimum 21 occurs when x=0.53 and y=1 $In_{0.53}Ga_{0.47}As$), while maximal base conduction band energy minimum 23 occurs when x=0 and y=0.5 ($GaAs_{0.5}Sb_{0.5}$). The conduction band offset $\Delta E_C$ 9 (see FIG. 1) between the material of the base, $In_xGa_{1-x}As_ySb_{1-y}$, and the material of the collector, InP, can be engineered to be between 0.12 eV and −0.25 eV, by adjusting the composition of the $In_xGa_{1-x}As_ySb_{1-y}$, base layer.

FIG. 1 shows lineups for band energies between preferred base material 1 and collector material 5. The most preferred base formulation within the described range achieves conduction band energy level 2, such that $\Delta E_C$ 9 is in the range of 0 to 10 meV. While $\Delta E_C$ is optimally 0 meV, in practice error may be difficult to avoid. If band alignment can only be controlled to within a range, then the base formulation should desirably be adjusted to offset the range such that $\Delta E_C$ 9 is non-negative. This can be accomplished by adjusting the base composition to offset the average conduction band energy minimum of the base so that it is slightly higher than that of InP. For example, $In_xGa_{1-x}As_ySb_{1-y}$ lattice-matched to InP achieves $\Delta E_C$ of 0 to 10 meV compared to InP when x is about 0.16 and y is about 0.65.

Bandgap 4 of base 1 is narrow, about 0.7 eV throughout the range of InGaAsSb materials which are lattice-matched to InP. Bandgap 8 of InP collector 5 is about 1.38 eV. The conduction band energy minimums of base and collector are preferably aligned, and hence $\Delta E_V$ 10, the difference between valence band energy minimum 3 of base 1 and valence band energy minimum 7 of collector 5, is about 0.68 eV.

Other materials, for example InAlAs or InAlAsSb or AlGaPSb lattice-matched to InP, may be employed in the emitter. (Throughout this application, InAlAs indicated without specifying composition will refer to $In_{0.52}Al_{0.48}As$, which is lattice-matched to InP.) InAlAs has a bandgap of about 1.5 eV. Its conduction band energy minimum is about 0.25 eV above that of InP (and hence above that of the preferred base material), such that $\Delta E_V$ 10 between InAlAs and preferred base 1 is about 0.55 eV, which is still desirably large. Other emitter materials are also likely to have a conduction band energy minimum differing from that of the base. In some instances a misalignment of conduction band energies between base and emitter can be useful, but often it is undesirable. The base-emitter junction may be graded to reduce the effects of conduction band misalignment. Delta doping techniques may be used to enhance the effectiveness of such grading, and also may be used to widen the junction depletion region to lower junction capacitance. In the case of InAlAs, grading and delta doping the junction may effectively shift the conduction band offset to the valence band, such that the effective valence band offset is 0.8 eV, and the conduction band offset is nearly zero.

Figure 3:
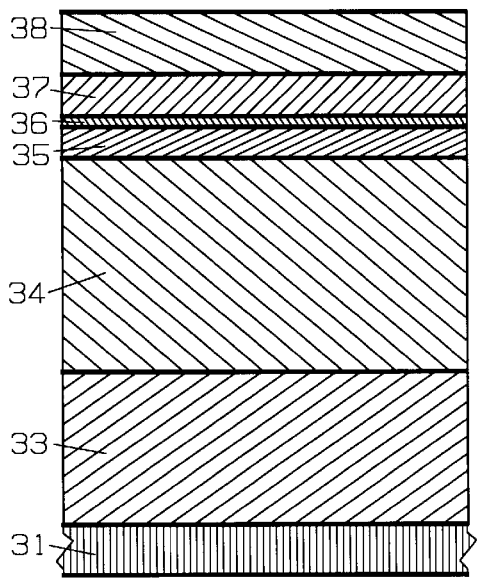
FIG. 3 depicts the epitaxial structure of an InP/InGaAsSb/InP DHBT.

FIGS. 3, 5 and 7 show epitaxial structures for forming DHBTs according to the present invention. One skilled in the art will understand that the following descriptions of layer structures are exemplary. The layer thicknesses and doping levels, in particular, may be varied by several orders of magnitude depending upon the desired application of devices according to the present invention. The scope of the present invention is also intended to encompasses wide variations in buffer layers, contact layers, and interconnect layers.

For convenience in supporting an unstrained InP collector structure, each of the preferred embodiments begins with semi-insulating InP substrate 31. At present it is preferred to achieve semi insulating properties for InP by doping it with Fe to about $10^{17}/cm^3$, thus forming a deep trap for defect-generated carriers. However, any compatible means of achieving at least semi-insulating properties for the InP substrate is acceptable. Indeed, a conductive substrate could be made effectively insulating by disposing an insulating layer between the conductive substrate and the layers of the actual transistor. Semi-insulating or insulating substrates of materials other than InP may also be employed, preferably lattice-matched to InP to facilitate growth of the InP collector without creation of crystal dislocation defects. A buffer layer may be desirable above non-InP substrates to facilitate epitaxial growth of devices according to the present invention.

FIG. 3 shows the epitaxial structure of a DHBT according to the present invention utilizing InP/InGaAsSb/InP. Subcollector 33 is grown above substrate 31. Subcollector 33 is preferably grown to a thickness of about 500 nm for high conductivity and ease of etching, and is preferably heavily n-doped to about $3 \times 10^{19}/cm^3$. Subcollector 33 is preferably InP, but may be other materials such as InGaAs.

Collector 34 is grown above subcollector 33, preferably to about 700 nm thick. Collector 34 is preferably InP, and is preferably lightly doped to about $3 \times 10^{16}/cm^3$.

Base 35 is grown above collector 34. Base 35 is preferably a quaternary compound formulation of $In_xGa_{1-x}As_ySb_{1-y}$ which has a conduction band energy minimum of 0 to 10 meV above that of InP collector 34, and which is lattice matched to InP. The preferred formulation is approximately $In_{0.16}Ga_{0.84}As_{0.65}Sb_{0.35}$ (x about 0.16 and y about 0.65). However, base 35 may also be somewhat compressively strained to InP, by increasing x and/or decreasing y somewhat from their lattice-matched value. This results in ranges for x and y which are expected to provide the best performance, with x ranging from 0.05 to 0.25, and y ranging from 0.55 to 0.75. It is desirable that base 35 not be in significant tensile strain to InP. If a strained compound is chosen, it is preferable that the thickness of base 35 be less than the critical thickness for the crystal so strained. Base 35 is preferably grown to a thickness of about 50 nm, and is preferably heavily p-doped to about $3 \times 10^{19}/cm^3$.

Figure 4:
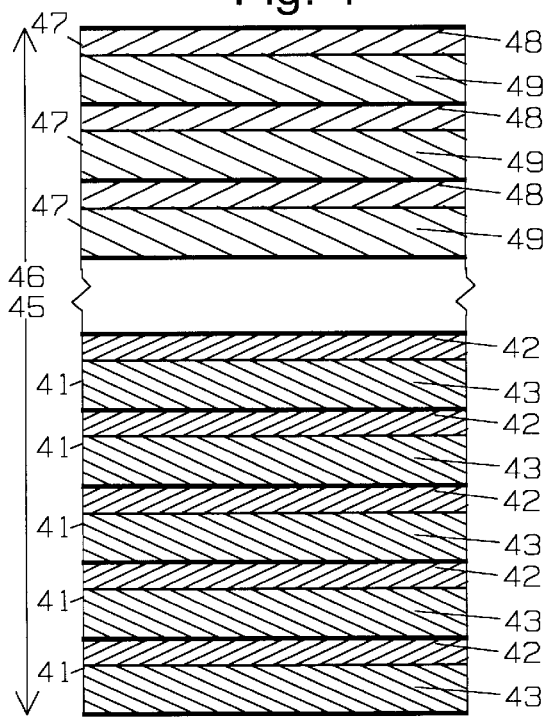
FIG. 4 shows an epitaxial structure for an optional superlattice base.

Referring to FIG. 4, base 35 may alternatively be grown as superlattice 45 of constituent materials, such as ternary compounds InGaAs and InGaSb. For example, $In_{0.16}Ga_{0.84}As_{0.65}Sb_{0.35}$ may be mimicked by superlattice 45 having a plurality of layer periods 41 each having thickness $T_P$, each layer period 41 including first sublayer 42 of $In_{0.16}Ga_{0.84}Sb$ grown to thickness $T_{s1}$ and second sublayers 43 of $In_{0.16}Ga_{0.84}As$ grown to thickness $T_{s2}$.

Preferably, $T_{s1}$ is $0.35*T_P$, and $T_{s2}$ is $0.65*T_P$, which keeps the same average molecular composition for superlattice base 45 as is provided by quaternary compound $In_{0.16}Ga_{0.84}As_{0.65}Sb_{0.35}$ in base 35 of FIG. 3.

Desirably, $T_P$ is as thin as practical. A preferred lower limit for $T_P$ is determined by the monolayer thickness for the thinner sublayer, in this example approximately 2.8 Å for $In_{0.16}Ga_{0.84}Sb$. Accordingly, $T_P$ is preferably at least about (2.8/0.35) Å, or 8 Å, leaving $T_{s1}$ about 2.8 Å and $T_{s2}$ about 5.2 Å. A practical upper limit for $T_P$ is about 100 Å, above which quantum well effects may impair performance.

In FIG. 3, optional doping offset layer 36 may be used to compensate for dopant diffusion effects. Doping offset layer 36 is preferably composed of the same material as base 35, but is undoped, and is preferably from 1–10 nm thick. Referring again to FIG. 4, optional superlattice doping offset layer 46 may be used with superlattice base 45. Superlattice doping offset layer 46 preferably uses period layers 47 each having first sublayer 48 composed of the same material as sublayers 42, except undoped, and second sublayers 49, composed of the same material as sublayers 43, except also undoped.

Returning to FIG. 3, emitter 37, in this embodiment is InP, and is preferably grown above base 35, and above base offset layer 36 if present, to a thickness of about 70 nm. Emitter 37 is preferably moderately n-doped to about $3 \times 10^{17}/cm^3$.

Emitter contact layer 38 is preferably grown above emitter 37 to a thickness of about 100 nm. It is preferably heavily n-doped to about $3 \times 10^{19}/cm^3$, and provides high conductivity and preferably a nearly perfect non-alloyed contact to metallization. Emitter contact layer 38 may be InP, or may be other materials, such as InGaAs.

FIG. 5 shows the epitaxial structure of an InAlAs/InGaAsSb/InP embodiment of a DHBT according to the present invention. Substrate 31, subcollector 33, collector 34, and base 35 are preferably as described in the InP/InGaAsSb/InP embodiment and depicted in FIG. 3, and may be similarly varied depending upon application. However, in this embodiment emitter 57 is preferably InAlAs lattice-matched to InP (or a superlattice mimicking such InAlAs). InAlAs has a desirably wide bandgap. However, the conduction band energy minimum of InAlAs is normally about 0.25 eV higher than that which is preferred for base 35.

The higher conduction band energy minimum of InAlAs has advantages for some applications. For example, electrons injected from emitter to base will have a higher energy level, which may reduce transit times and enhance the speed of the device. Thus, a device having an abrupt base-emitter junction of InGaAsSb/InAlAs is not only simpler to fabricate, it will have certain advantageous characteristics. However, the barrier created by the misalignment also has disadvantages, such as increasing power consumption, and thus this is not the most preferred embodiment of the invention.

Optional grading layer 56 may desirably be added to grade the conduction band energy discontinuity by grading the material transition between base and emitter. Grading layer 56 may be doped like the emitter, preferably moderately n-doped to about $3 \times 10^{17}/cm^3$. Grading layer 56 may also be doped such that part of it acts like optional doping offset layer 36, by omitting or reducing the doping of a portion of the grading layer nearest the heavily doped base. Furthermore, it may incorporate a delta doping plane of heavy n-type doping at a certain distance from the edge of heavy base doping in order to improve the alignment effects which effectively shift the conduction band energy minimum offset into the valence band.

Above base 35 and optional grading layer 56, emitter 57 is grown of InAlAs to a preferable thickness of about 70 nm, and is moderately n-doped to a density of about $3 \times 10^{17}/cm^3$. InAlAs lattice-matched to InP is an example of a material other than InP which may be employed for the emitter of a device according to the present invention. Other materials which are nearly lattice-matched to InP may also be used, preferably in conjunction with techniques like those described for an InAlAs emitter for grading and aligning conduction band discontinuities between such emitter and base 35.

Emitter contact layer 58 is grown above emitter layer 57, preferably to a thickness of about 100 nm, and preferably heavily n-doped to a density of about $3 \times 10^{19}/cm^3$. InGaAs is a preferred material for emitter contact layer 58, since it forms a perfect non-alloyed ohmic contact to metallization disposed on it. Other materials are possible for emitter contact layer 58.

Grading Layer

Optional grading layer 56 is preferably about 20–30 nm thick. It can be fabricated by changing the material composition continuously, or in small steps, or by means of a chirped superlattice. For continuous material composition changing, it is preferred that on the base side of grading layer 56 the material is $In_{0.52}(Al_{0.45}Ga_{0.55})_{0.48}As$, and the material is gradually changed until, on the emitter side of grading layer 56, the material is $In_{0.52}Al_{0.48}As$. The gradual change of composition can be done by continuously changing the material from which grading layer 56 is grown. Alternatively, one can shift the material in steps as grading layer 56 is grown, in a stepwise or chirped fashion.

FIG. 6A shows the layer structure of a 9-period chirped superlattice which is a preferred embodiment for constructing optional grading layer 56. Layer periods 61A–69A each preferably have sublayers 51A (or 53A) comprising a first material, and sublayers 52A (or 54A) comprising a second material. Sublayers 51A and 53A are preferably both of the same material composition, e.g. $In_{0.52}Al_{0.48}As$, except sublayers 51A may be doped differently from sublayers 53A; similarly, sublayers 52A and 54A are preferably both the same material composition, e.g. $In_{0.52}Ga_{0.48}As$, except for optionally different doping. The proportional thickness of layers 51A versus layers 52A (or 53A versus 54A) within successive periods will vary to control the overall average composition of each period. Period layer 61A is disposed nearest base 56, and period layer 69A is disposed nearest emitter 57.

In period layer 61A, sublayer 53A of first material $In_{0.52}Al_{0.48}As$ is about 45% of the thickness of period layer 61A, while sublayer 54A of second material $In_{0.52}Ga_{0.48}As$ is about 55% of the thickness. The proportion of first material $In_{0.52}Al_{0.48}As$ increases by about 6.1% in each successive period, while the proportion of second material $In_{0.52}Ga_{0.48}As$ decreases about 6.1% in each successive period, until sublayer 51A (of the first material) is about 93.9% of the thickness of period layer 69A, and sublayer 52A (of the second material) is about 6.1% of the thickness of period layer 69A.

FIG. 6B shows an alternative to the above embodiment of grading layer 56. Most of the discussion of the above references, suffixed "A," applies in FIG. 6B to similarly-numbered references suffixed "B." In FIG. 6B the first material, used in sublayers 51B and 53B, is still $In_{0.52}Al_{0.48}As$, but the second material, used in sublayers 52B and 54B, is preferably InGaAsSb in the proportional composition used in the base. The proportional thickness of sublayers 51B and 53B is increased by about 10% in each successive period from about 10% of layer period 61B, until in layer period 69B sublayer 51B is about 90%. Correspondingly, sublayers 52B and 54B are step-wise reduced each period from about 90% of layer period 61B to about 10% of layer period 69B.

Many variations are possible in the fabrication of grading layer 56. The equal steps established by the proportions described above are convenient but not essential. Many more, or fewer, grading steps can be used. Different materials can be used.

The entire grading layer 56 may be uniformly doped, preferably at the density used for emitter 57, or it may be varied across the grading layer. For example, sublayers 51, 52 (A or B) of period layers 63–69 (A or B) may be n-doped similarly as emitter 57, while sublayers 53, 54 (A or B) of period layers 61, 62 (A or B) are left undoped to function as a doping offset layer, performing the function of optional layer 36 (shown in FIG. 3). One skilled in the art should realize that changes in doping level may be made anywhere in the grading layer, and indeed the doping levels of grading layer 56 need not match that of either base or emitter. For example, in an embodiment of the present invention which is a variation of that shown in FIG. 6, period layers 61–63 (A or B) may be heavily p-doped like base 35, period layers 64–66 (A or B) may be left undoped, and period layers 67–69 (A or B) may be moderately n-doped like emitter 57. FIG. 6 shows that periods 61 and 62 (A or B) have sublayers 51 and 53 (A or B), while periods 63–69 (A or B) have sublayers 52 and 54 (A or B). One skilled in the art will realize that this is one of many ways to shift the doping within the superlattice, and that the transition may be made at any appropriate point within the superlattice. The grading layer doping may be uniform, even uniformly zero, particularly in the case that a delta doping plane is employed. Thus, a wide range of grading layer doping alternatives exist. The number of period layers can also vary, readily ranging from about 5 to 20 or more.

Delta Doping

The conduction band energy minimum discontinuity between the base and an InAlAs emitter is largely graded across optional grading layer 56, even if grading layer 56 is uniformly doped. However, particularly desirable delta doping arrangements may be used to advantage. In one such arrangement, grading layer 56 is 30 nm thick and is left undoped. The first 70 nm of emitter 37 nearest grading layer 56 is also left undoped, or lightly doped. After growing the first 70 nm of emitter 37, growth may be suspended, while an n-type dopant such as Si continues to be added until the structure surface achieves a sheet charge of $6 \times 10^{11}/cm^2$ or $1 \times 10^{12}/cm^2$. Achievement of such a sheet charge may be accomplished while growing the material, also. A particular advantage of this arrangement is that the depletion region is quite wide, so that the capacitance of the junction is reduced compared to a narrower depletion region.

In another delta doping arrangement, grading layer 56 is 30–100 nm, and a similar sheet charge, adjusted approximately linearly with distance from the base, is provided in the edge of emitter 57 adjacent grading layer 56. An advantage of this arrangement is to provide a linear change in voltage gradient across grading layer 56 to match the linear (or step-wise linear) grading of material, such that the effective conduction band energy minimum transition from base to emitter is as flat as possible. Thereby the conduction band energy of base and emitter are optimally aligned, and the valence band energy shift between base and emitter is optimally large.

FIG. 7 shows the epitaxial layer structure of an embodiment of the present invention which permits symmetrical transistor fabrication, either emitter-up or collector-up depending upon the connections made to the device. Substrate 3i is as described above with respect to FIG. 3.

For emitter-up configuration, subcollector 73 is grown above substrate 31 as described above with respect to FIG. 3, preferably employing InP or InGaAs, grown to a thickness of about 500 nm and heavily doped to a density of about $3*10^{19}/cm^3$. except fabricated InP collector 74 is preferably about 300 nm, and is moderately n-doped to a density of about $3*10^{16}/cm^3$. Base 75 may be a quaternary compound of InGaAsSb, lattice matched to InP or somewhat compressively strained thereto, or may be a superlattice mimicking such a compound, as discussed previously in regard to the base in the embodiments depicted in FIGS. 3 and 5. Base 75 is preferably grown to a thickness of about 50 nm, and heavily p-doped to a density of about $3*10^{19}/cm^3$. Emitter 77 in this symmetrical embodiment is preferably the same thickness as collector 74, about 300 nm, and has the same n-doping to a density of about $3*10^{16}/cm^3$. Emitter contact 78 is preferably grown to about 100 nm thickness InP or InGaAs, heavily n-doped to about $3*10^{19}/cm^3$.

For an alternative collector-up configuration, each layer 73–78 may be constructed as described above, but layer 73 may be employed as an emitter contact layer, layer 74 as the emitter, layer 77 as the collector and layer 78 as a collector contact layer. Thus, the construction is symmetrical enough to provide very similar performance in transistors fabricated in either collector- or emitter-up configurations.

Devices fabricated in accordance with this embodiment of the present invention may, of course, employ widely varying layer thicknesses and doping densities depending upon application. If a doping offset layer (not shown) of different or absent doping is desired then two symmetrical layers should preferably be grown to maintain symmetry in this embodiment, one disposed between layers 74 and 75 and the other disposed between layers 75 and 76. However, if balanced performance is not essential then the requirements for symmetry may be relaxed while still permitting both collector-up and emitter-up configurations.

Fabrication Techniques

For completeness, FIGS. 8–13 show etching steps for fabricating a transistor in accordance with the present invention. Those skilled in the art will understand that the described fabrication steps are merely exemplary, and that an infinite number of variations in fabrication techniques are possible within the scope of the present invention.

The epitaxial structures described above, preferably grown upon prefabricated substrates, can be established by any means known now or developed in the future. Growth may be effected by, for example, Molecular Beam Epitaxy (MBE) or Metal Organic Vapor-Phase Epitaxy (MOVPE) techniques which are well-known in the art, and one skilled in the art will understand that any technique, whether now known or developed in future, may be used to achieve the described layer structures. One skilled in the art will also appreciate that the epitaxial layer thicknesses and doping levels given are also merely examples, and that the DHBT structure of the present invention is expected to work well with a wide variety of epitaxial layer thicknesses and doping levels, and indeed with a wide range of alternative layer structures.

Doping to n type is preferably accomplished using Si, Sn or other common group IV elements. Doping to p type is preferably accomplished using Be, C or Zn. However, any dopant compatible with the device materials to achieve the desired doping levels is acceptable.

Metallization may be accomplished by any compatible technique, such as sputtering, unless otherwise noted. The preferred metal is a combination of separate layers of titanium (about 100 Å), platinum (about 300 Å), and gold (about 1000 Å), generally denoted as simply Ti/Pt/Au.

Etches may be any compatible standard dry or wet etch, with testing of the depth achieved in those instances when the layer to be reached is thin and a selective wet etch is not available.

FIGS. 8–13 show fabrication of a DHBT according to the present invention. First, an epitaxial structure according to one of the preferred embodiments described above is grown. FIG. 8 shows substrate 31, subcollector 33, collector 34, base 35, emitter 37, and emitter contact layer 38. For simplicity, optional doping offset layer 36 and optional grading layer 56 are not shown. An oxide cap layer of about 50 Å, not shown, may be placed above emitter contact layer 38 after growth of the epitaxial structure to protect the structure until further processing takes place.

FIG. 8 also shows photoresist 82A, which has been patterned to define the emitter metallization contact area. Any oxide cap in the emitter metallization contact area is first removed, and then first metallization 83A is deposited onto the surface to achieve a thickness of about 4000 Å. As is well known in the art, the side walls of the photoresist layer are controlled to have negative or vertical slope, so that the metallization does not attach thereto. Photoresist 52A will then be removed, and will lift off that portion of metallization 83A which is above photoresist 82A.

FIG. 9 shows the device after the "lift off" of unused first metallization 83A to leave emitter metallization 91, and after a subsequent etch using emitter metallization 91 as a mask, which leaves emitter 93 defined. The etch may be any standard, compatible dry or liquid etch, and removes the unused portion of the emitter layers 37 and 38 to expose base 35.

FIG. 10 shows, in cross section, second photoresist 82 which has been patterned and upon which second metallization 83B has been deposited. Upon "lift off" of second photoresist layer 82B, that portion of metallization 83B remaining upon base 35 preferably forms a single contact 111 (FIG. 11) surrounding emitter 8 (but appearing as two pieces in cross section).

In addition to base contact 111, FIG. 11 shows third photoresist 82C, which is patterned with void 113 which will define the collector contact. After the photoresist is patterned as shown in FIG. 11, it is used for two subsequent steps.

FIG. 12 shows the device after the two steps referred to above: base 35 and collector 34 have been etched away using third photoresist 82C as a mask to expose subcollector 33; and metallization has been deposited, which after photoresist 82C is removed becomes collector contact metal 121. FIG. 12 shows the device after photoresist layer 82C has been used for the two steps, and then has been removed along with the unused metallization.

FIG. 13 shows the device after a further photoresist, not shown, has been patterned to cover the entire device and thus to be used as a mask to enable a mesa etch to isolate the entire device structure down to (and somewhat into) substrate 31. Collector contact metal 121 is positioned upon subcollector 33. Collector 34 supports both base 35, upon which base contact metal 111 is positioned, and emitter 93 (which typically includes emitter 37 and emitter contact layer 38, not shown). Emitter contact metal 91 is defined above emitter 93. A final passivation of the device, not shown, may desirably be performed on the device shown in FIG. 11, as is well known in the art.

The DHBT device described herein is exemplary. The fabrication steps can readily be adapted to devices employing any of the described embodiments of the present invention. Those skilled in the art will understand that a wide variety of techniques, whether now known or hereafter developed, are encompassed within the following claims for forming devices according to the present invention. For example, one might build a device laterally using Lateral Epitaxial Overgrowth, might add or delete some layers, and might alter doping levels and thicknesses. Only the following claims define the scope of the invention.

What is claimed is:

1. A method of forming a heterojunction bipolar transistor comprising the steps of:
    forming a collector structure of predominantly InP;
    forming a base structure which is predominantly In, Ga, As and Sb, proportions of these elements relative to each other within said base structure being the same as in a quaternary compound $In_xGa_{1-x}As_ySb_{1-y}$ in which x and y are selected such that a conduction band energy minimum of the quaternary compound is substantially aligned with a conduction band energy minimum of InP; and
    forming an emitter structure of predominantly InAlAsSb.

2. The method of forming a bipolar transistor according to claim 1 wherein said emitter structure includes an emitter nearest the base and an emitter contact layer.

3. The method of forming a bipolar transistor of claim 2 including a further step of forming a layer which at least partially grades a transition between said base and said emitter.

4. The method of forming a bipolar transistor according to claim 1 wherein a region is defined between the base and an edge of the emitter farthest from the base, the method including a step of doping a delta doping layer within said region to a density exceeding the doping density of regions immediately adjacent the delta doping layer by at least an order of magnitude.

5. The method of forming a bipolar transistor according to claim 1 including a further step of forming a layer which at least partially grades a transition between said base and said emitter.

6. A method of forming a bipolar transistor comprising the steps of:
    forming a collector including InP;
    forming, adjacent said collector, a base including In, Ga, As and Sb, said base having a conduction band energy minimum which is substantially aligned with a conduction band energy minimum of said collector; and
    forming an emitter opposite said base from said collector, wherein said emitter includes a member selected from the group consisting of InAsSb and AlGaPSb.

7. The method of forming a bipolar transistor of claim 6 wherein said emitter is lattice-matched to InP, the method including a step of forming a grading layer between the base and the emitter.

8. The method of claim 7 wherein the step of forming a grading layer includes forming a superlattice.

9. A double heterojunction bipolar transistor device comprising:
    a collector including InP;
    a base which is predominantly In, Ga, As and Sb in proportions relative to each other which are the same as in a quaternary compound $In_xGa_{1-x}As_ySb_{1-y}$ and which has a conduction band energy minimum substantially aligned with a conduction band energy minimum of InP; and an emitter structure, wherein said emitter includes a member selected from the group consisting of InAlAsSb and AlGaPSb.

10. The transistor device of claim 9 further comprising a grading layer disposed between said base and said emitter.

11. The transistor device of claim 9 further comprising a delta doping layer disposed within a region defined between said base and an edge of said emitter farthest from said base.

12. A method of forming a heterojunction bipolar transistor comprising the steps of:

forming a collector structure of predominantly InP;

forming a base structure which is predominantly In, Ga, As and Sb, proportions of these elements relative to each other within said base structure being the same as in a quaternary compound $In_xGa_{1-x}As_ySb_{1-y}$ in which x and y are selected such that a conduction band energy minimum of the quaternary compound is substantially aligned with a conduction band energy minimum of InP; and forming an emitter structure of predominantly AlGaPSb.

13. The method of forming a bipolar transistor according to claim 12 wherein said emitter structure includes an emitter nearest the base and an emitter contact layer.

14. The method of forming a bipolar transistor of claim 13 including a further step of forming a layer which at least partially grades a transition between said base and said emitter.

15. The method of forming a bipolar transistor according to claim 12 wherein a region is defined between the base and an edge of the emitter farthest from the base, the method including a step of doping a delta doping layer within said region to a density exceeding the doping density of regions immediately adjacent the delta doping layer by at least an order of magnitude.

16. The method of forming a bipolar transistor according to claim 12 including a further step of forming a layer which at least partially grades a transition between said base and said emitter.

* * * * *